United States Patent
Shen

(10) Patent No.: US 8,237,249 B2
(45) Date of Patent: Aug. 7, 2012

(54) STACKED MULTICHIP PACKAGE

(75) Inventor: Geng Hsin Shen, Tainan (TW)

(73) Assignee: Chipmos Technologies Inc., Hsinchu (TW)

( * ) Notice: Subject to any disclaimer, the term of this patent is extended or adjusted under 35 U.S.C. 154(b) by 406 days.

(21) Appl. No.: 12/557,390

(22) Filed: Sep. 10, 2009

(65) Prior Publication Data

US 2010/0244278 A1 Sep. 30, 2010

(30) Foreign Application Priority Data

Mar. 27, 2009 (TW) ................................ 98110065 A

(51) Int. Cl.
*H01L 23/495* (2006.01)

(52) U.S. Cl. ........ 257/668; 257/676; 257/686; 257/777; 257/778; 438/123

(58) Field of Classification Search .................. 257/668, 257/676, 686, 777, 778, E23.116, E23.141; 438/123

See application file for complete search history.

(56) References Cited

U.S. PATENT DOCUMENTS

| 5,471,369 A * | 11/1995 | Honda et al. .................. 361/813 |
| 5,830,800 A | 11/1998 | Lin |
| 6,001,671 A | 12/1999 | Fjelstad |
| 2007/0018303 A1* | 1/2007 | Lee ............................... 257/686 |

FOREIGN PATENT DOCUMENTS

| TW | 411035 | 11/2000 |
| TW | 445601 | 7/2001 |
| TW | 454322 | 9/2001 |
| TW | 465803 | 11/2001 |
| TW | 497757 | 8/2002 |
| TW | 563901 | 11/2003 |
| TW | 200913088 | 3/2009 |
| TW | 200913217 | 3/2009 |

* cited by examiner

*Primary Examiner* — Theresa T Doan
(74) *Attorney, Agent, or Firm* — WPAT, P.C.; Anthony King

(57) ABSTRACT

A stacked multichip package comprises a first chip having a first active surface and a first rear surface, a first chip carrier having a first opening and being configured to carrier the first active surface, a plurality of first conductive leads passing through the first opening and being configured to electrically connect the first active surface and the first chip carrier, a second chip having a second active surface and a second rear surface, an adhesive layer configured to enclose the first conductive leads and to electrically couple the first chip carrier to the second rear surface, a second chip carrier having a second opening and being electrically connected to the second active surface, and a plurality of conductive leads passing through the second opening and being configured to electrically connect the second active surface and the second chip carrier.

18 Claims, 1 Drawing Sheet

STACKED MULTICHIP PACKAGE

BACKGROUND OF THE INVENTION

1. Field of the Invention

The present invention relates to a semiconductor chip package, and relates more particularly to a stacked multichip package.

2. Description of the Related Art

Integration of multiple stacked chips into a single package can increase electronic component package density and reduce the signal distances between electronic components. In other words, the integration technique can not only decrease the total volume required to prepare for individual chips, but can also improve the integral performance of the chips. Among the techniques for packaging multiple stacked chips, the package technique for multiple stacked chips of the same size is one of the most common package techniques.

In the package technique for multiple stacked chips of the same size, a plurality of chips of the same size are stacked one upon another on a substrate and the active surfaces of the chips usually face upward for convenient to wire bond. To prevent bonding wires of a lower chip from being damaged or shorted by an upper chip, interposers are provided between the chips. The height of each interpose should be greater than the loop heights of the corresponding bonding wires. Conventionally, the interposer can be a polyimide tape, a dummy chip, a metal piece, etc.

However, using interposers requires additional processes such as, for example, a chip attach adhesive coating process, a chip mounting process, and a curing process. Such additional processes increase manufacturing cost and risk lowering manufacturing yield.

Specifically, manufacturing yield is an important consideration in the production of multiple chip packages. When multiple chips are packaged into an encapsulation body, the result of composite manufacturing yields greatly influences manufacturing cost. In particular, when the encapsulation body includes a high-priced chip, the risk of low manufacturing yield is more important. If a low price chip in the encapsulation body malfunctions or if a chip is damaged during the chip stacking process, the high-priced chip will have to be discarded with the nonfunctional chip, and such discard causes serious impact to the manufacturing cost.

Thus, in light of the trend of multiple chip package development and the high cost risk of multiple chip packages, a low cost and high manufacturing yield multichip package structure is required by the packaging industry.

SUMMARY OF THE INVENTION

The present invention provides a stacked multichip package, which uses a chip carrier to carrier a chip stacked above another chip disposed on a substrate to form a stacked multichip package. The stacked multichip package of the present invention built using high yield chip package technique and chip stack technique has an advantage of high yield.

According to one embodiment of the present invention, the stacked multichip package comprises a first chip having a first active surface and a first rear surface, a first chip carrier having a first opening and being attached to the first active surface, a plurality of first conductive leads passing through the first opening and configured to electrically couple the first active surface to the first chip carrier, a second chip having a second active surface and a second rear surface, an adhesive layer surrounding the plurality of first conductive leads and configured to bond the first chip carrier to the second rear surface, a second chip carrier having a second opening and being attached to the second active surface, a plurality of second conductive leads passing through the second opening and configured to electrically couple the second active surface to the second chip carrier; and a plurality of third conductive leads for electrically coupling the first chip carrier to the second chip carrier.

According to another embodiment of the present invention, the stacked multichip package comprises a first chip having a first active surface and a first rear surface, a first chip carrier having a first opening and being attached to the first active surface, a plurality of first conductive leads passing through the first opening and configured to electrically couple the first active surface to the first chip carrier, a second chip having a second opening and a second rear surface, an adhesive layer surrounding the plurality of first conductive leads and configured to bond the first chip carrier to the second rear surface, a second chip carrier having a second opening, being attached to the second active surface and electrically coupled to the first chip carrier, and a plurality of second conductive leads passing through the second opening and configured to electrically couple the second active surface to the second chip carrier.

In one embodiment, the first chip carrier in the above-described stacked multichip package is a printed circuit board, a flexible circuit board or a lead frame.

In one embodiment, the areas of the first chip and the second chip in the above-described stacked multichip package are the same.

In one embodiment, the adhesive layer in the above-described stacked multichip package is an FOW (Film on Wire) film.

In one embodiment, the above-described stacked multichip package may further comprise an encapsulation body for enclosing the first chip, the first chip carrier, the second chip and the plurality of second conductive leads.

BRIEF DESCRIPTION OF THE DRAWINGS

The invention will be described according to the appended drawings in which.

DETAILED DESCRIPTION OF THE INVENTION

Figure 1:
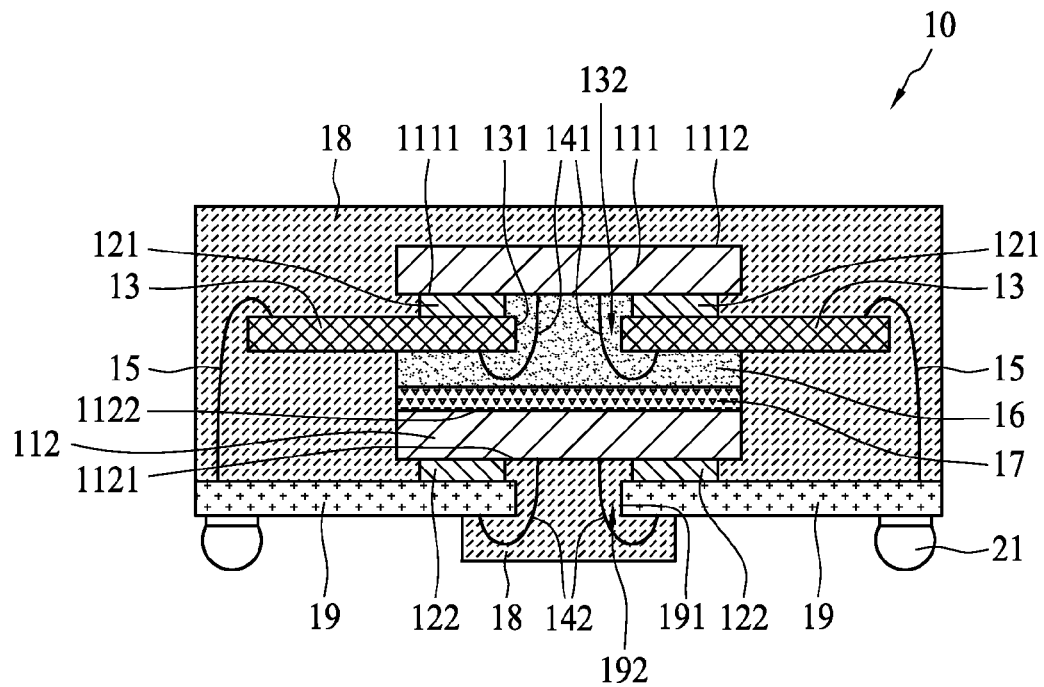
FIG. 1 is a cross sectional view showing a stacked multichip package according to the first embodiment of the present invention.

FIG. 1 is a cross sectional view showing a stacked multichip package 10 according to the first embodiment of the present invention. The stacked multichip package 10 of the first embodiment of the present invention comprises a first chip 111, a first chip carrier 13, a plurality of first conductive leads 141, a second chip 112, an adhesive layer 16, a second chip carrier 19, and a plurality of second conductive leads 142. The first chip 111 comprises a first active surface 1111 and a first rear surface 1112 opposite to the first active surface 1111. An integrated circuit including a plurality of electronic components and conductive traces connecting the electronic components is formed on the first active surface 1111. The first chip carrier 13 includes an inner wall 131 defining a first opening 132. The first active surface 1111 of the first chip 111 faces toward the first opening 132, and is attached to the first chip carrier 13. In the present embodiment, the first chip 111 and the first chip carrier 13 can be attached using a die attach paste, a die attach tape, or a die attach film.

The plurality of first conductive leads 141 pass through the first opening 132 of the first chip carrier 13, electrically coupling the first active surface 1111 of the first chip 111 to the surface of the first chip carrier 13 opposite to the surface attached to the first chip 111. The adhesive layer 16 is disposed on the surface of the first chip carrier 13 opposite the surface attached to the first chip 111 and is deposited into the first opening 132 of the first chip carrier 13, surrounding the plurality of first conductive leads 141. In the present embodiment, the adhesive layer 16 can be an FOW (film over wire) film, which can allow the height of a package to be decreased and protects the conductive leads to improve the stability thereof.

The second chip 112 comprises a second active surface 1121 and a second rear surface 1122 opposite to the second active surface 1121. An integrated circuit including a plurality of electronic components and conductive traces connecting the electronic components is formed on the second active surface 1121. The second chip carrier 19 includes an inner wall 191 defining a second opening 192. The second active surface 1121 of the second chip 112 faces toward the second opening 192, and is attached to the second chip carrier 19. In the present embodiment, the second chip 112 and the second chip carrier 19 can be attached using an adhesive 122 such as a die attach paste, a die attach tape, or a die attach film.

The plurality of second conductive leads 142 pass through the second opening 192 of the second chip carrier 19, electrically coupling the second active surface 1121 of the second chip 112 to the surface of the second chip carrier 19 opposite to the surface attached to the second chip 112. The adhesive layer 16 disposed on the first chip carrier 13 and the first chip 111 is attached to the second rear surface 1122 of the second chip 112, and the plurality of third conductive leads 15 electrically couples the first chip carrier's surface attached to the first chip 111 to the second chip carrier's surface attached to the second chip 112. The encapsulation body 18 encloses the first chip 111, the first chip carrier 13, the second chip 112, and the third conductive leads 15; the encapsulation body 18 is filled into the second opening 192 of the second chip carrier 19 and encloses the second conductive leads 142 so as to form the stacked multichip package 10 of the first embodiment of the present invention. Preferably, in the present embodiment, between the adhesive layer 16, which is disposed on the first chip carrier 13 and the first chip 111, and the rear surface 1122 of the second chip 12, a dielectric layer 17 can be disposed to prevent the first conductive leads 141 from contacting the second chip 112 to cause short-circuiting, and simultaneously to bond the first chip 111 to the second chip 112.

In the present embodiment, the first chip carrier 13 can be a printed circuit board or a lead frame, and the second chip carrier 19 can be a printed circuit board, a lead frame or a flexible circuit board. In addition, on the surface of the second chip carrier 19 opposite to the surface attached to the second chip 112, a plurality of external contacts 21 such as solder balls can be disposed.

Figure 2:
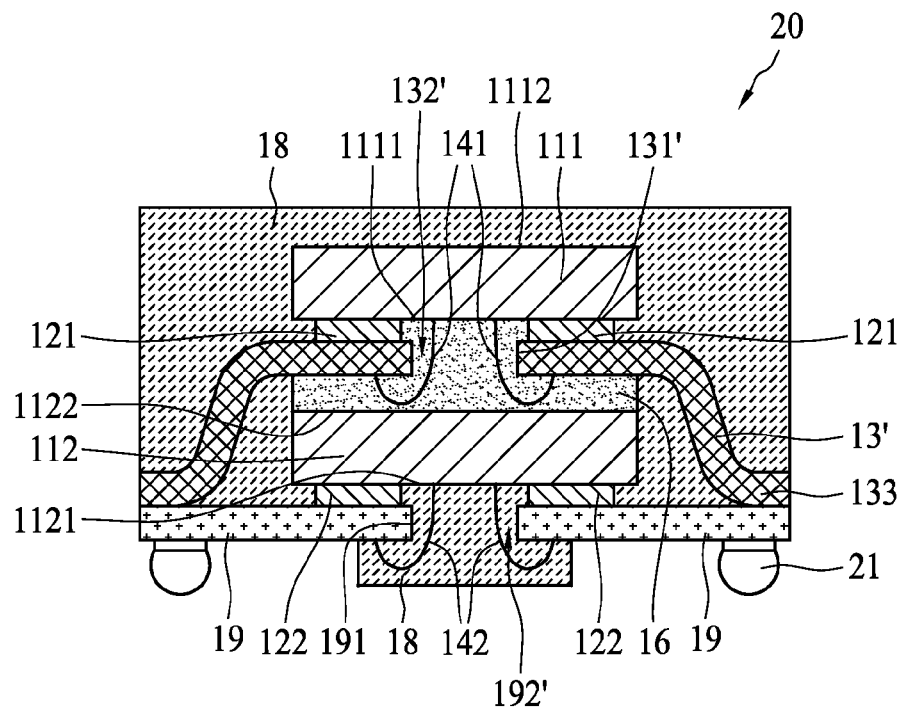
FIG. 2 is a cross sectional view showing a stacked multichip package according to the second embodiment of the present invention.

FIG. 2 is a cross sectional view showing a stacked multichip package 20 according to the second embodiment of the present invention. Referring to FIGS. 1 and 2, the stacked multichip package 20 of the first embodiment of the present invention comprises a first chip 111, a first chip carrier 13', a plurality of first conductive leads 141, a second chip 112, an adhesive layer 16, a second chip carrier 19, and a plurality of second conductive leads 142. The first chip 111 comprises a first active surface 1111 and a first rear surface 1112 opposite to the first active surface 1111. An integrated circuit including a plurality of electronic components and conductive traces connecting the electronic components is formed on the first active surface 1111. The first chip carrier 13' includes an inner wall 131' defining a first opening 132'. The first active surface 1111 of the first chip 111 faces toward the first opening 132', and is attached to the first chip carrier 13'. In the present embodiment, the first chip 111 and the first chip carrier 13' can be attached using an adhesive 121 such as a die attach paste, a die attach tape, or a die attach film.

The plurality of first conductive leads 141 pass through the first opening 132' of the first chip carrier 13', electrically coupling the first active surface 1111 of the first chip 111 to the surface of the first chip carrier 13' opposite to the surface attached to the first chip 111. The adhesive layer 16 is disposed on the surface of the first chip carrier 13' opposite the surface attached to the first chip 111 and is deposited into the first opening 132' of the first chip carrier 13', surrounding the plurality of first conductive leads 141. In the present embodiment, the adhesive layer 16 can be an FOW (film over wire) film, which can allow the height of a package to be decreased and protects the conductive leads to improve the stability thereof.

The second chip 112 comprises a second active surface 1121 and a second rear surface 1122 opposite to the second active surface 1121. An integrated circuit including a plurality of electronic components and conductive traces connecting the electronic components is formed on the second active surface 1121. The second chip carrier 19 includes an inner wall 191 defining a second opening 192'. The second active surface 1121 of the second chip 112 faces toward the second opening 192', and is attached to the second chip carrier 19. In the present embodiment, the second chip 112 and the second chip carrier 19 can be attached using an adhesive 121 such as a die attach paste, a die attach tape, or a die attach film.

The plurality of second conductive leads 142 pass through the second opening 192' of the second chip carrier 19, electrically coupling the second active surface 1121 of the second chip 112 to the surface of the second chip carrier 19 opposite to the surface attached to the second chip 112.

The adhesive layer 16 disposed on the first chip carrier 13' and the first chip 111 is attached to the second rear surface 1122 of the second chip 112, and the two lateral end portions of the first chip carrier 13' can be deformed so that the contacts (not shown) on each lateral end portion 133 can electrically connect to the second chip carrier 19. The encapsulation body 18 encloses the first chip 111, the first chip carrier 13', the second chip 112, and the third conductive leads 15; the encapsulation body 18 is filled into the second opening 192' of the second chip carrier 19 and encloses the second conductive leads 142 so as to form the stacked multichip package 20 of the first embodiment of the present invention. In the present embodiment, the first chip carrier 13' includes a flexible circuit board and a lead frame. In another embodiment, between the adhesive layer 16, which is disposed on the first chip carrier 13' and the first chip 111, and the rear surface 1122 of the second chip 12, a dielectric layer (not shown) can be disposed, as shown in the first embodiment, to prevent the first conductive leads 141 from contacting the second chip 112 to cause short-circuiting, and simultaneously to bond the first chip 111 to the second chip 112.

The second chip carrier 19 can be a printed circuit board, a lead frame or a flexible circuit board.

In addition, on the surface of the second chip carrier 19 opposite to the surface attached to the second chip 112, a plurality of external contacts 21 such as solder balls can be disposed.

In the present embodiment of the invention, the first chip 111 and the second chip 112 can be matched in size such that the stacked multichip packages 10 and 20 are chip packages of multiple single size chips.

In the present embodiment of the invention, the first chip 111 and the second chip 112 can be dynamic random access memories.

The adhesive layer 16 utilized in the present invention can be an FOW (film over wire) film, which can allow the height of a package to be decreased and protects the conductive leads to improve the stability thereof. Simultaneously, a dielectric layer 17 can further be disposed to prevent the first conductive leads 141 from contacting the second chip 112 to cause short-circuiting, and to bond the first chip 111 to the second chip 112. The above-described two assemblies can be tested before assembly. As such, the risk of discarding high-priced chips can be reduced and the manufacturing yield can be increased.

The above-described embodiments of the present invention are intended to be illustrative only. Numerous alternative embodiments may be devised by persons skilled in the art without departing from the scope of the following claims.

What is claimed is:

1. A stacked multichip package, comprising:
a first chip having a first active surface and a first rear surface;
a first chip carrier having a first opening, the first chip carrier being attached to the first active surface;
a plurality of first conductive leads passing through the first opening and configured to electrically couple the first active surface to the first chip carrier;
a second chip having a second active surface and a second rear surface;
an adhesive layer surrounding the plurality of first conductive leads and configured to bond the first chip carrier to the second rear surface, wherein the first chip carrier is positioned between the first chip and the second chip;
a second chip carrier having a second opening, the second chip carrier being attached to the second active surface;
a plurality of second conductive leads passing through the second opening and configured to electrically coupled the second active surface to the second chip carrier; and
a plurality of third conductive leads for electrically coupling the first chip carrier to the second chip carrier.

2. The stacked multichip package of claim 1, further comprising an encapsulation body for enclosing the first chip, the first chip carrier, the second chip and the plurality of second conductive leads.

3. The stacked multichip package of claim 1, wherein the first chip carrier is a printed circuit board or a lead frame.

4. The stacked multichip package of claim 1, wherein the adhesive layer is an FOW film.

5. The stacked multichip package of claim 1, wherein the first chip and the first chip carrier are attached using a die attach paste, a die attach tape, or a die attach film.

6. The stacked multichip package of claim 1, wherein the second chip and the second chip carrier are attached using a die attach paste, a die attach tape, or a die attach film.

7. The stacked multichip package of claim 1, wherein the second chip carrier is a printed circuit board, a lead frame, or a flexible circuit board.

8. The stacked multichip package of claim 1, wherein the adhesive layer is filled into the first opening.

9. The stacked multichip package of claim 1, further comprising a dielectric layer disposed between the adhesive layer and the second rear surface.

10. The stacked multichip package of claim 1, further comprising a plurality of external contacts disposed on a surface of the second chip carrier.

11. The stacked multichip package of claim 1, wherein the areas of the first chip and the second chip are the same.

12. A stacked multichip package, comprising:
a first chip having a first active surface and a first rear surface;
a first chip carrier having a first opening, the first chip carrier being attached to the first active surface;
a plurality of first conductive leads passing through the first opening and configured to electrically couple the first active surface to the first chip carrier;
a second chip having a second opening and a second rear surface;
an adhesive layer surrounding the plurality of first conductive leads and configured to bond the first chip carrier to the second rear surface, wherein the first chip carrier is positioned between the first chip and the second chip;
a second chip carrier having a second opening, the second chip carrier being attached to the second active surface and electrically coupled to the first chip carrier; and
a plurality of second conductive leads passing through the second opening and configured to electrically couple the second active surface to the second chip carrier.

13. The stacked multichip package of claim 12, wherein the first chip carrier is a flexible circuit board or a lead frame with a plurality of contacts for electrical connection to the second chip carrier.

14. The stacked multichip package of claim 12, wherein the adhesive layer is an FOW film.

15. The stacked multichip package of claim 12, wherein the adhesive layer is deposited into the first opening.

16. The stacked multichip package of claim 12, further comprising a plurality of external contacts disposed on a surface of the second chip carrier.

17. The stacked multichip package of claim 12, wherein the areas of the first chip and the second chip are the same.

18. The stacked multichip package of claim 12, further comprising a dielectric layer disposed between the adhesive layer and the second rear surface.

* * * * *